United States Patent
Ok et al.

(10) Patent No.: US 10,505,111 B1
(45) Date of Patent: Dec. 10, 2019

(54) CONFINED PHASE CHANGE MEMORY WITH DOUBLE AIR GAP

(71) Applicant: INTERNATIONAL BUSINESS MACHINES CORPORATION, Armonk, NY (US)

(72) Inventors: Injo Ok, Loudonville, NY (US); Balasubramanian Pranatharthiharan, Watervliet, NY (US); Wei Wang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/040,849

(22) Filed: Jul. 20, 2018

(51) Int. Cl.
| | |
|---|---|
| H01L 23/48 | (2006.01) |
| H01L 45/00 | (2006.01) |
| H01L 21/764 | (2006.01) |
| H01L 23/532 | (2006.01) |
| H01L 21/768 | (2006.01) |

(52) U.S. Cl.
CPC .......... H01L 45/1293 (2013.01); H01L 45/06 (2013.01); H01L 45/1253 (2013.01); H01L 45/144 (2013.01); H01L 45/1616 (2013.01); *H01L 21/764* (2013.01); *H01L 21/76832* (2013.01); *H01L 23/5329* (2013.01)

(58) Field of Classification Search
CPC .................................................. H01L 29/0847
See application file for complete search history.

(56) References Cited

U.S. PATENT DOCUMENTS

| | | | |
|---|---|---|---|
| 6,815,704 B1 | 11/2004 | Chen | |
| 7,504,674 B2* | 3/2009 | Farrar | H01L 21/76801 257/213 |
| 8,110,430 B2 | 2/2012 | Lung | |
| 8,305,800 B2 | 11/2012 | Tu | |
| 9,076,790 B1* | 7/2015 | Wu | H01L 23/53266 |
| 9,231,201 B2* | 1/2016 | Van Schaijk | B82Y 10/00 |
| 9,245,962 B1* | 1/2016 | Yang | H01L 29/42344 |
| 9,660,188 B2 | 5/2017 | Lin et al. | |
| 9,719,688 B2 | 8/2017 | Holloway et al. | |
| 2002/0137276 A1* | 9/2002 | Park | H01L 21/76802 438/241 |
| 2006/0121721 A1* | 6/2006 | Lee | H01L 21/76808 438/618 |
| 2016/0071868 A1* | 3/2016 | Arai | H01L 23/528 257/325 |
| 2016/0111326 A1* | 4/2016 | Ohori | H01L 21/76843 438/653 |

(Continued)

OTHER PUBLICATIONS

Fong et al., "Phase-Change Memory-Towards a Storage-Class Memory", IEEE Transactions on Electron Devices. vol. 64. Issue No. 11. Nov. 2017. pp. 4374-4385.

(Continued)

*Primary Examiner* — Thao P Le
(74) *Attorney, Agent, or Firm* — Tutunjian & Bitetto, P.C.; L. Jeffrey Kelly

(57) ABSTRACT

A method is presented for reducing heat loss to adjacent semiconductor structures. The method includes forming a plurality of conductive lines within an interlayer dielectric, forming a barrier layer over at least one conductive line of the plurality of conductive lines, forming a via extending to a top surface of the barrier layer, and defining dual air gaps within the via and over the barrier layer.

20 Claims, 6 Drawing Sheets

(56) References Cited

U.S. PATENT DOCUMENTS

2016/0126130 A1* 5/2016 Takahashi ............ H01L 21/7682
                                                                257/774
2017/0256488 A1* 9/2017 Lee ..................... H01L 23/53295
2017/0365504 A1* 12/2017 Choi .................... H01L 21/7682

OTHER PUBLICATIONS

Park et al., "20nm DRAM: A new beginning of another revolution", 2015 IEEE International Electron Devices Meeting. Dec. 7, 2015. pp. 1-4.

* cited by examiner

CONFINED PHASE CHANGE MEMORY WITH DOUBLE AIR GAP

BACKGROUND

Technical Field

The present invention relates generally to semiconductor devices, and more specifically, to confined phase change memory with double air gap.

Description of the Related Art

A phase-change memory (PRAM) is one of next-generation nonvolatile memory devices that are expected to meet an increasing demand for a high-performance and low-power semiconductor memory device. In PRAM devices, data can be stored or erased by heating or cooling a phase-change layer therein. However, there can be thermal interference between adjacent memory cells.

SUMMARY

In accordance with an embodiment, a method is provided for reducing heat loss to adjacent semiconductor structures. The method includes forming a plurality of conductive lines within an interlayer dielectric, forming a barrier layer over at least one conductive line of the plurality of conductive lines, forming a via extending to a top surface of the barrier layer, and defining dual air gaps within the via and over the barrier layer.

In accordance with another embodiment, a method is provided for reducing heat loss to adjacent semiconductor structures. The method includes forming a barrier layer over at least one conductive line of a plurality of conductive lines, forming a via to the first barrier layer, defining a first air gap between Ge—Sb—Te (germanium-antimony-tellurium or GST) alloy layers, and defining second air gaps on opposed ends of the first air gap.

In accordance with yet another embodiment, a semiconductor device is provided for reducing heat loss to adjacent semiconductor devices. The semiconductor device includes a plurality of conductive lines disposed within an interlayer dielectric, a barrier layer disposed over at least one conductive line of the plurality of conductive lines, a first air gap defined within a dielectric, and second air gaps defined on opposed ends of the first air gap.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
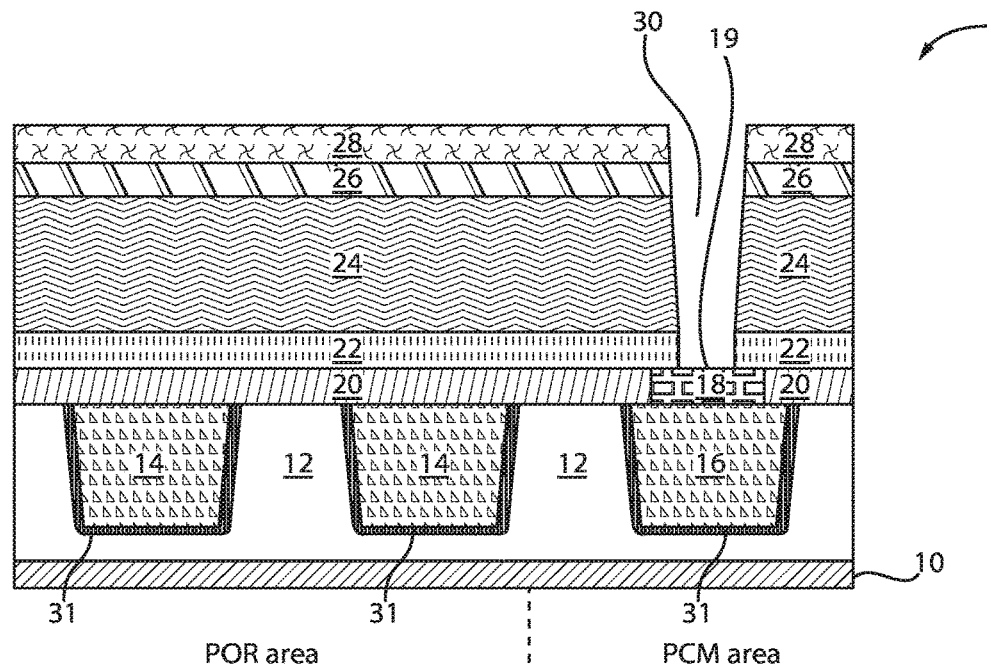
FIG. 1 is a cross-sectional view of a semiconductor structure including a plurality of conductive lines formed within a dielectric layer and a via formed to extend to a barrier layer constructed over at least one conductive line, in accordance with an embodiment of the present invention.

Embodiments in accordance with the present invention provide methods and devices for forming double air gaps in phase change memory cells in order to, e.g., reduce heat loss to surrounding structures or devices.

Embodiments in accordance with the present invention provide methods and devices for employing phase change based materials in nonvolatile random access memory cells. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a plurality of conductive lines formed within a dielectric layer and a via formed to extend to a barrier layer constructed over at least one conductive line, in accordance with an embodiment of the present invention.

A semiconductor structure 5 includes a plurality of conductive lines 14, 16 formed within trenches of an inter-layer dielectric (ILD) 12. The ILD 12 can be formed over a substrate 10. A conductive fill material or liner 31 can be formed or deposited around each of the trenches. In one example, the liner 31 can be a tantalum nitride (TaN) liner 31 or in the alternative a tantalum (Ta) liner 31. In one example embodiment, the conductive fill material 31 can be deposited, for example, by electroplating, electroless plating, chemical vapor deposition (CVD), atomic layer deposition (ALD) and/or physical vapor deposition (PVD). The top surface of the ILD 12 is flush with the top surface of the conductive lines 14, 16.

In various example embodiments, a barrier layer 18 can be formed over the exposed conductive line 16. The barrier layer 18 can be, e.g. a tantalum nitride (TaN) layer. The barrier layer 18 extends over a portion of the upper surface of the conductive line 16. The barrier layer 18 can have a thickness between about 36 nm and about 56 nm.

In various example embodiments, a first capping layer 20 and a second capping layer 22 can be deposited over the conductive lines 14, 16. The first and second capping layers 20, 22 can also be referred to as etch stop layers. The etch stop layers 20, 22 can be formed of, e.g., silicon nitride (SiN) or silicon carbon nitride (SiCN) (nBLOK). In one exemplary embodiment, the etch stop layer 20 is formed of SiN and the etch stop layer 22 is formed of nBLOK. The etch stop layer 20 can have a thickness of about 20 nm and the etch stop layer 22 can have a thickness of about 30 nm. Etch stop layers 20, 22 can include any insulating material that can serve as a layer in which an etching process can be stopped on. Illustratively, the etch stop layers 20, 22 can include an oxide, nitride, oxynitride or any combination thereof.

In various example embodiments, an interlayer dielectric layer 24 can be deposited over the etch stop layers 20, 22. In one example, the interlayer dielectric layer 24 can be, e.g., tetraethylorthosilicate (TEOS).

In various example embodiments, a first sacrificial layer 26 and a second sacrificial layer 28 can be formed over the interlayer dielectric layer 24. The first sacrificial layer 26 can be, e.g., a SiN layer and the second sacrificial layer 28 can be a titanium nitride (TiN) hardmask.

In various example embodiments, a via 30 is formed to expose a top surface 19 of the barrier layer 18 formed over the conductive line 16 in the phase change material (PCM) area of the device or structure.

The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The ILD 12 can include any materials known in the art, such as, for example, porous silicates, carbon doped oxides, silicon dioxides, silicon nitrides, silicon oxynitrides, or other dielectric materials. The ILD 12 can be formed using any method known in the art, such as, for example, chemical vapor deposition, plasma enhanced chemical vapor deposition, atomic layer deposition, or physical vapor deposition. The ILD 12 can have a thickness ranging from about 25 nm to about 200 nm.

The dielectric material of layer 12 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal lines 14, 16 can be formed in the openings or trenches formed in the ILD 12. The metal lines 14, 16 can be any conductive materials known in the art, such as, for example, copper (Cu), aluminum (Al), or tungsten (W). The metal lines 14, 16 can be fabricated using any technique known in the art, such as, for example, a single or dual damascene technique. In an embodiment, not illustrated, the metal lines 14, 16 can be copper (Cu) and can include a metal liner, where a metal liner can be metals, such as, for example, tantalum nitride and tantalum (TaN/Ta), titanium, titanium nitride, cobalt, ruthenium, and manganese.

The barrier layer 18 exists on metal lines in phase change memory (PCM) regions only. Moreover, selective growth of barrier layer 18 (e.g., TaN, TiN, W, Co, Ru) can be performed.

Suitable inorganic dielectrics that can be employed as the interlayer dielectric 24 can include Si, O and H, and optionally C, e.g., $SiO_2$, SiCOH, carbon-doped oxides (CDO), silicon-oxicarbides, organosilicate glasses (OSG) deposited by plasma enhanced chemical vapor deposition (CVD) techniques. Illustrative examples of some types of inorganic dielectrics 24 that can be employed include, but are not limited to: the silsesquioxane HOSP, methylsilsesquioxane (MSQ), hydrido silsesquioxane (HSQ), MSQ-HSQ copolymers, tetraethylorthosilicate (TEOS), organosilanes and any other Si-containing material. The thickness of the interlayer dielectric 24 can be from about 100 nm to about 120 nm.

The dielectric 24 can be a low-k dielectric material and can have a dielectric constant that is less than 4.0, e.g., 3.9. In one embodiment, the low-k material layer 24 can have a dielectric constant ranging from about 1.0 to about 3.5. In another embodiment, the low-k material layer 24 can have a dielectric constant ranging from about 1.75 to about 3.2.

One example of a material suitable for the low-k materials for the low-k dielectric layer 24 can include silicon oxycarbonitride (SiOCN). Other low-k materials that can also be used for the low-k dielectric layer 24 can include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 24 can be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

The hardmask layers 26, 28 can be a nitride, for example, a silicon nitride (SiN), an oxynitride, for example, silicon oxynitride (SiON), or a combination thereof. In a preferred embodiment, the hardmask layers 26, 28 can be silicon nitride (SiN), for example, $Si_3N_4$.

In one or more embodiments, the hardmask layers 26, 28 can have a thickness in the range of about 20 nm to about 100 nm, or in the range of about 35 nm to about 75 nm, or in the range of about 45 nm to about 55 nm, although other thicknesses are contemplated. In another example the first sacrificial layer 26 has a thickness of about 25 nm and the second sacrificial layer 28 has a thickness of about 25 nm.

Figure 2:
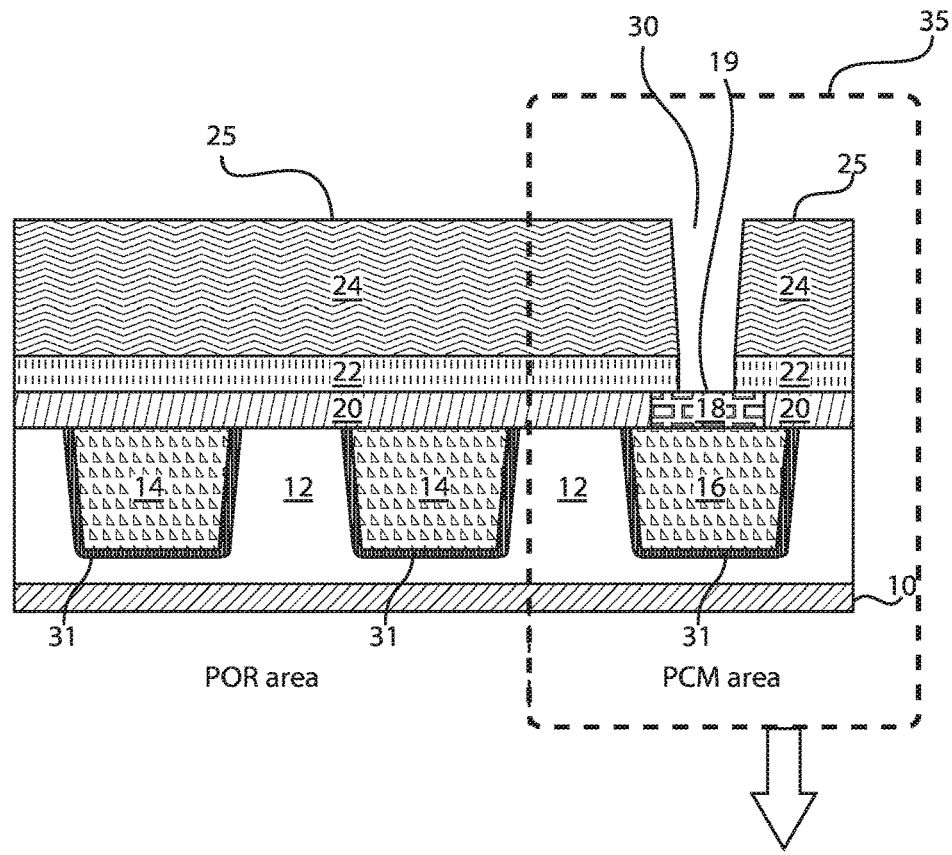
FIG. 2 is a cross-sectional view of the semiconductor structure of FIG. 1 where a plurality of sacrificial layers are removed, in accordance with an embodiment of the present invention.

FIG. 2 is a cross-sectional view of the semiconductor structure of FIG. 1 where a plurality of sacrificial layers are removed, in accordance with an embodiment of the present invention.

In various example embodiments, the first and second sacrificial layers 26, 28 are removed to expose a top surface 25 of the interlayer dielectric 24. In the next sequence of FIGS, the PCM section 35 of the device will only be reproduced for sake of clarity. Additionally, the etch stop layer 22 can be omitted for further clarity.

Figure 3:
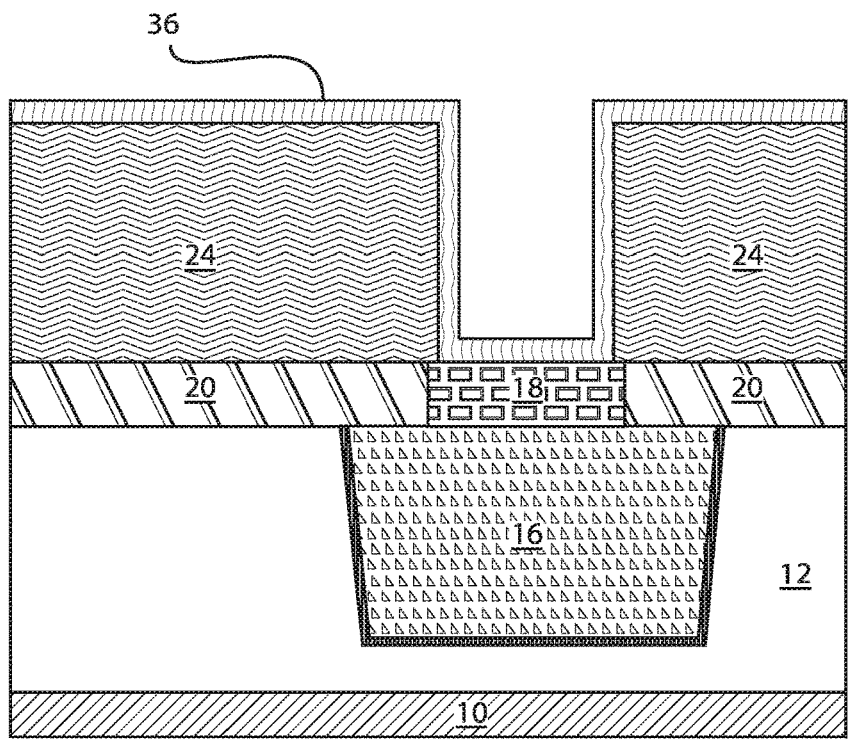
FIG. 3 is a cross-sectional view of the semiconductor structure of FIG. 2 where a sacrificial material is deposited, in accordance with an embodiment of the present invention.

FIG. 3 is a cross-sectional view of the semiconductor structure of FIG. 2 where a sacrificial material is deposited, in accordance with an embodiment of the present invention.

In various example embodiments, a sacrificial material 36 is deposited over the dielectric 24 and the barrier layer 18.

Figure 4:
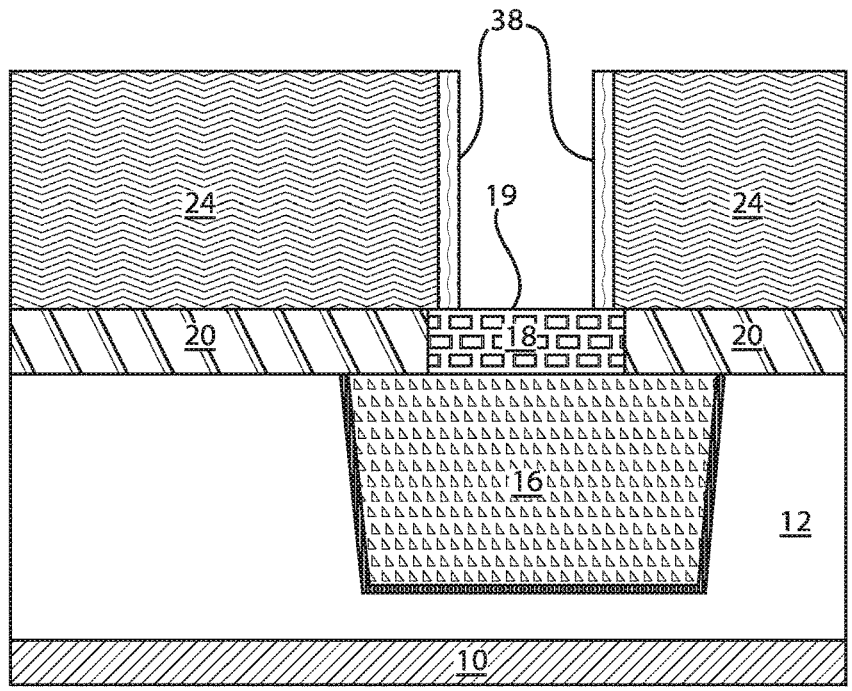
FIG. 4 is a cross-sectional view of the semiconductor structure of FIG. 3 where the sacrificial material is etched such that a top surface of the barrier layer is exposed, in accordance with an embodiment of the present invention.

FIG. 4 is a cross-sectional view of the semiconductor structure of FIG. 3 where the sacrificial material is etched such that a top surface of the barrier layer is exposed, in accordance with an embodiment of the present invention.

In various example embodiments, the sacrificial material is etched to form sacrificial material sections or portions 38 adjacent sidewalls of the dielectric 24. A top surface 19 of the barrier layer 18 is now exposed.

Figure 5:
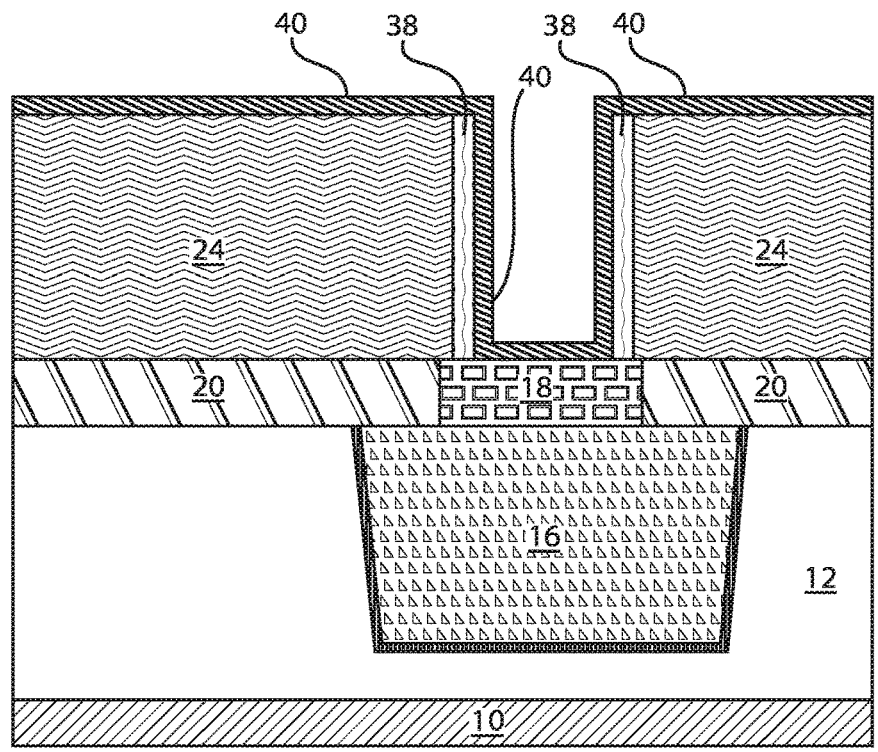
FIG. 5 is a cross-sectional view of the semiconductor structure of FIG. 4 where a spacer is formed, in accordance with an embodiment of the present invention.

FIG. 5 is a cross-sectional view of the semiconductor structure of FIG. 4 where a spacer is formed, in accordance with an embodiment of the present invention.

In various example embodiments, a spacer material 40 is deposited.

The spacer 40 can be formed by performing a deposition process, for example, a physical vapor deposition process (PVD) (e.g., sputtering). The spacer 40 can include one layer or multiple layers of conductive materials. For example, the spacer 40 can include ruthenium, niobium, palladium, or any combination thereof. The spacer 40 can include a highly doped semiconductor material that is conductive. For example, the spacer 40 can include, for example, doped polysilicon.

The thickness of the spacer 40 can generally vary and is not intended to be limited. In some embodiments, the thickness of the spacer 40 is in a range from about 20 to about 50 nm. In other embodiments, the thickness of the spacer 40 is in a range from about 25 to about 45 nm.

Figure 6:
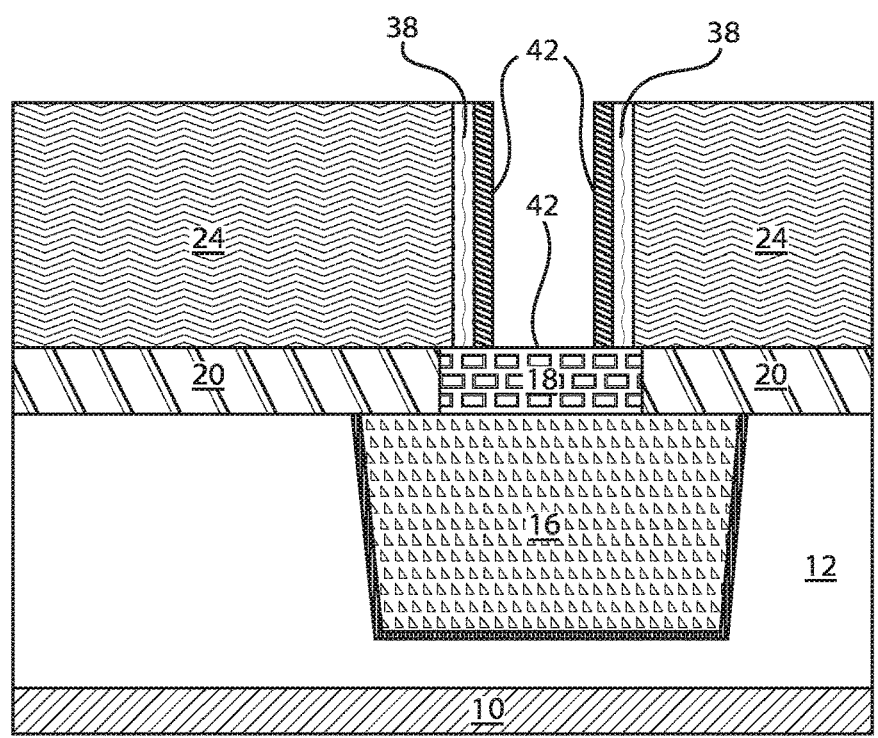
FIG. 6 is a cross-sectional view of the semiconductor structure of FIG. 5 where the spacer is etched to expose the top surface of the barrier layer, in accordance with an embodiment of the present invention.

FIG. 6 is a cross-sectional view of the semiconductor structure of FIG. 5 where the spacer is etched to expose the top surface of the barrier layer, in accordance with an embodiment of the present invention.

In various example embodiments, the spacer material 40 is etched to form spacer sections or portions 42 adjacent the sidewalls of the sacrificial material sections or portions 38.

Figure 7:
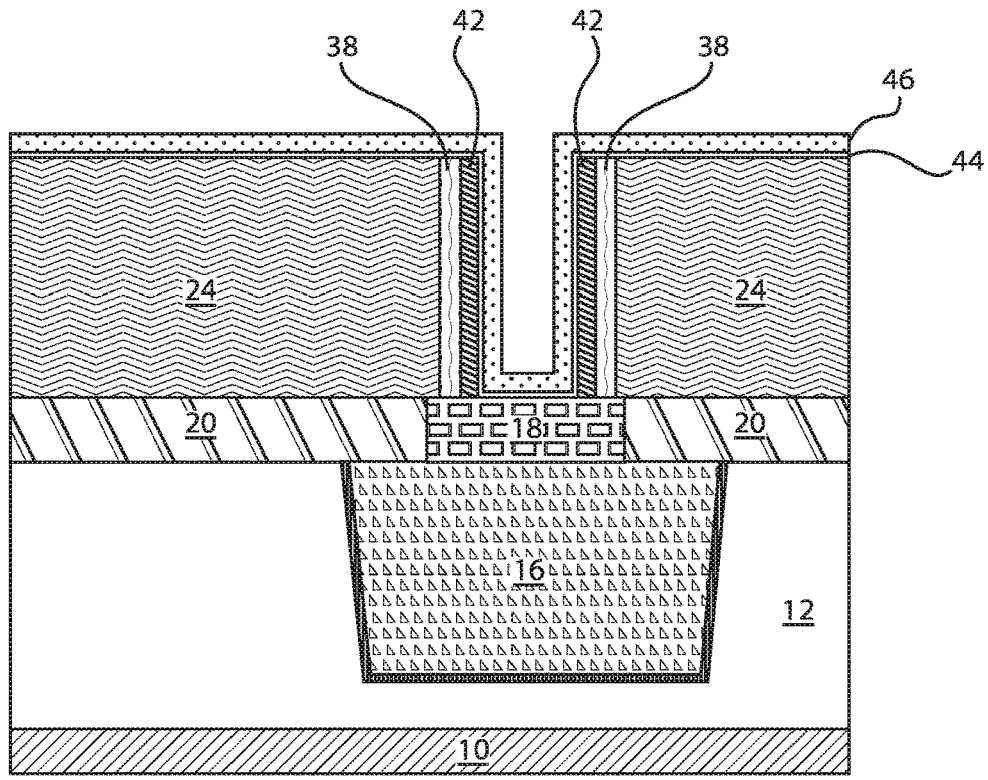
FIG. 7 is a cross-sectional view of the semiconductor structure of FIG. 6 where a dielectric liner and a Ge—Sb—Te (germanium-antimony-tellurium or GST) alloy are deposited, in accordance with an embodiment of the present invention.

FIG. 7 is a cross-sectional view of the semiconductor structure of FIG. 6 where a dielectric liner and a Ge—Sb—

Te (germanium-antimony-tellurium or GST) alloy are deposited, in accordance with an embodiment of the present invention.

In various example embodiments, a dielectric liner 44 and a GST alloy layer 46 are deposited.

The dielectric liner 44 can be a conformal dielectric liner. The dielectric liner 44 can have a thickness that is greater than 10 nm. The dielectric liner 44 can be, e.g., a silicon nitride (SiN) liner. The liner material can also be another dielectric material, such as a low k material (e.g., SiBCN, SiOC, etc.).

In the present example, the phase change material layer 46 preferably includes a Ge—Sb—Te (germanium-antimony-tellurium or "GST") alloy. Alternatively, other suitable materials for the phase change material layer 46 optionally include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, and combinations thereof.

The phase change material layer 46 is configured to be substantially amorphous following back-end-of-line ("BEOL") semiconductor processing. In one example, the phase change material layer 46 can be deposited with a thickness that is less than about 20 nm and a deposition temperature that is less than about 200° C. The phase change material layer 46 can be deposited by a physical vapor deposition ("PVD") (also referred to as "sputtering") process.

GST material 46 has a melting point of about 620° C., and is capable of existing in amorphous and crystalline states. To form the amorphous (high resistivity) phase, at least a portion of the material is heated to a temperature above the melting point thereof by applying a relatively high current through the material between the electrodes (the heat being generated due to the electrical resistance of the phase change material) for as little as 10 to 100 nanoseconds. As the GST material 46 quickly cools when the current is interrupted, the atoms of the GST do not have sufficient time to form an ordered crystalline state, and the amorphous phase of the GST material 46 is formed. To form the crystalline (low resistivity) phase, at least a portion of the material can be heated to a temperature of about 550° C., which is above the crystallization temperature and near, but below, the melting point of the GST material, by applying a relatively lower current through the GST material 46 between the electrodes for a sufficient amount of time (e.g., as little as about 30 nanoseconds) to allow the atoms of the GST material 46 to assume the long-range order associated with the crystalline phase, after which the current flowing through the material can be interrupted. The current passed through the phase change material to cause a phase change therein can be referred to as the "programming current."

Figure 8:
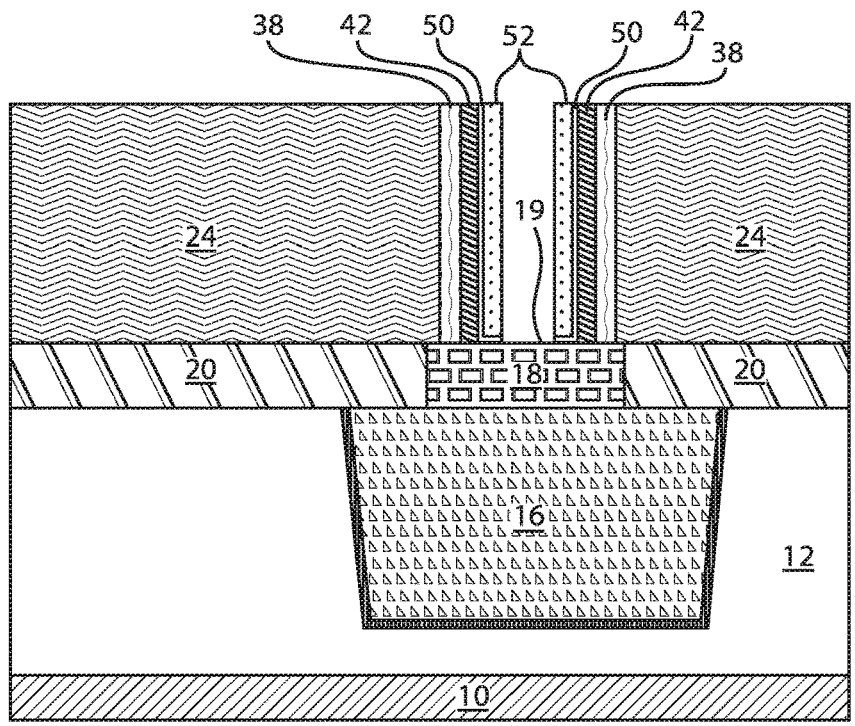
FIG. 8 is a cross-sectional view of the semiconductor structure of FIG. 7 where the dielectric liner and GST alloy are etched, in accordance with an embodiment of the present invention.

FIG. 8 is a cross-sectional view of the semiconductor structure of FIG. 7 where the dielectric liner and GST alloy are etched, in accordance with an embodiment of the present invention.

In various example embodiments, the dielectric liner 44 and the GST layer 46 are etched to form dielectric liner sections or portions 50 and GST layer sections or portions 52. The dielectric liner sections or portions 50 are formed adjacent sidewalls of the spacer sections or portions 42. The GST layer sections or portions 52 are formed adjacent sidewalls of the dielectric liner sections or portions 50. A top surface 19 of the barrier layer is also re-exposed. It is noted that three layers 38, 42, 50 contact a top surface of the barrier layer 18.

Figure 9:
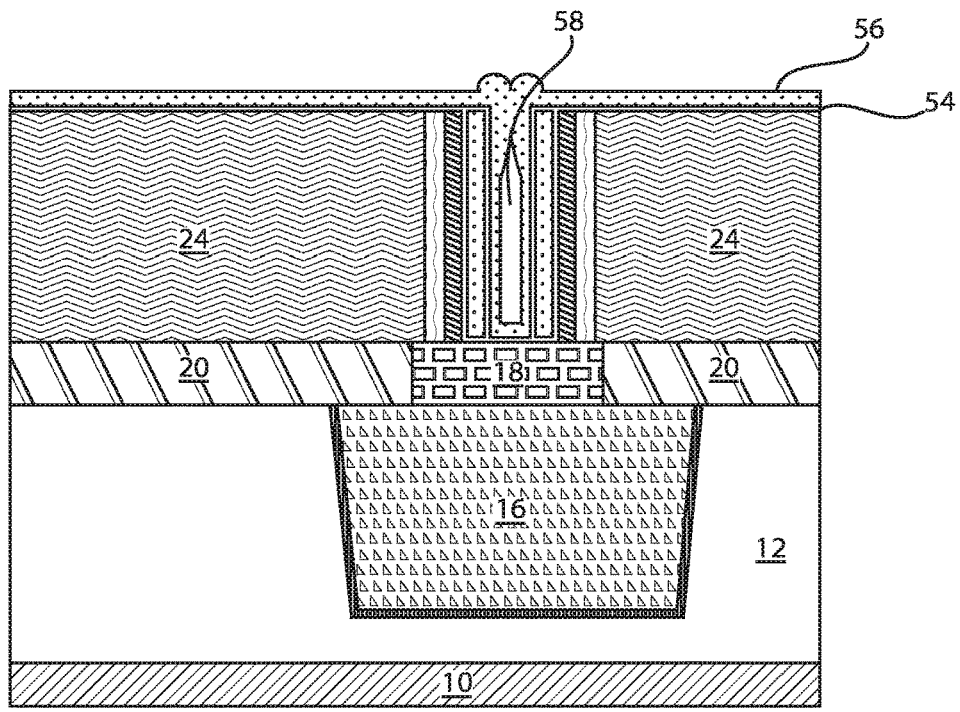
FIG. 9 is a cross-sectional view of the semiconductor structure of FIG. 8 where a second spacer is deposited to form a first air gap (or inner air gap), in accordance with an embodiment of the present invention.

FIG. 9 is a cross-sectional view of the semiconductor structure of FIG. 8 where a second spacer is deposited to form a first air gap (or inner air gap), in accordance with an embodiment of the present invention.

In various example embodiments, a second dielectric liner 54 is deposited and then a dielectric 56 can be deposited such that cavities or air gap 58 is formed within the dielectric 56. The dielectric 56 can be, e.g., an oxide. The air gap 58 can be formed between the layers 38, 42, 50, 52. The air gap 58 can be referred to as a first air gap or an inner air gap.

Figure 10:
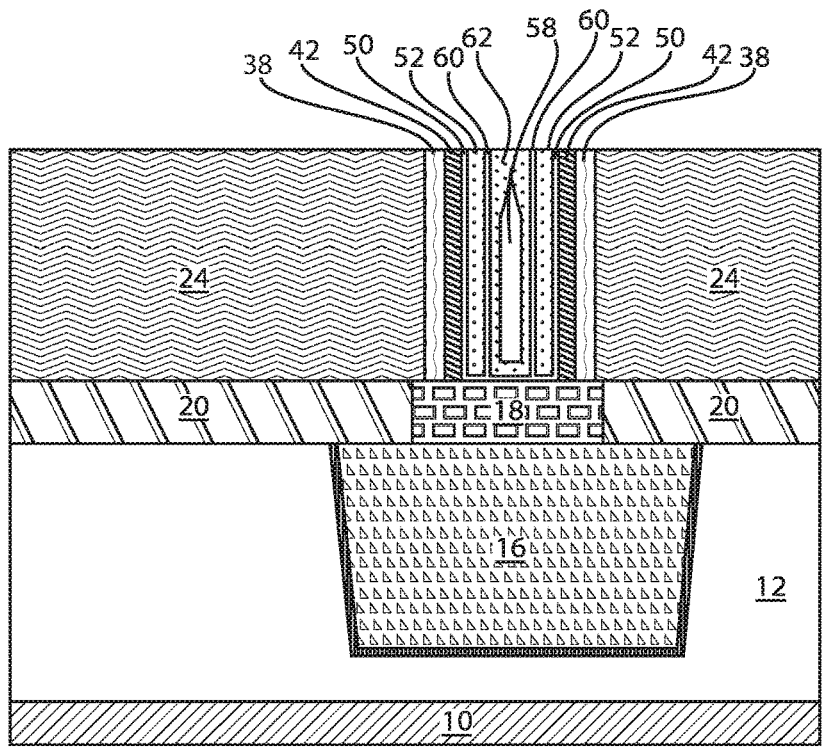
FIG. 10 is a cross-sectional view of the semiconductor structure of FIG. 9 where the second spacer is etched to expose a top surface of the low-k material, in accordance with an embodiment of the present invention.

FIG. 10 is a cross-sectional view of the semiconductor structure of FIG. 9 where the second spacer is etched to expose a top surface of the low-k material, in accordance with an embodiment of the present invention.

In various example embodiments, the height of the second dielectric liner 54 and the height of the dielectric 56 can be reduced by chemical-mechanical polishing (CMP) and/or etching. Therefore, the planarization process can be provided by CMP. Other planarization process can include grinding and polishing. This results in the exposure of top surfaces of layers 38, 42, 50, 52, as well as remaining layers 60, 62 of the second dielectric liner 54 and the dielectric 56, respectively. In other words, layers 60 are remains of second dielectric liner and layers 62 are remains of dielectric 56. The first air gap 58 remains intact within the remaining dielectric 62.

Figure 11:
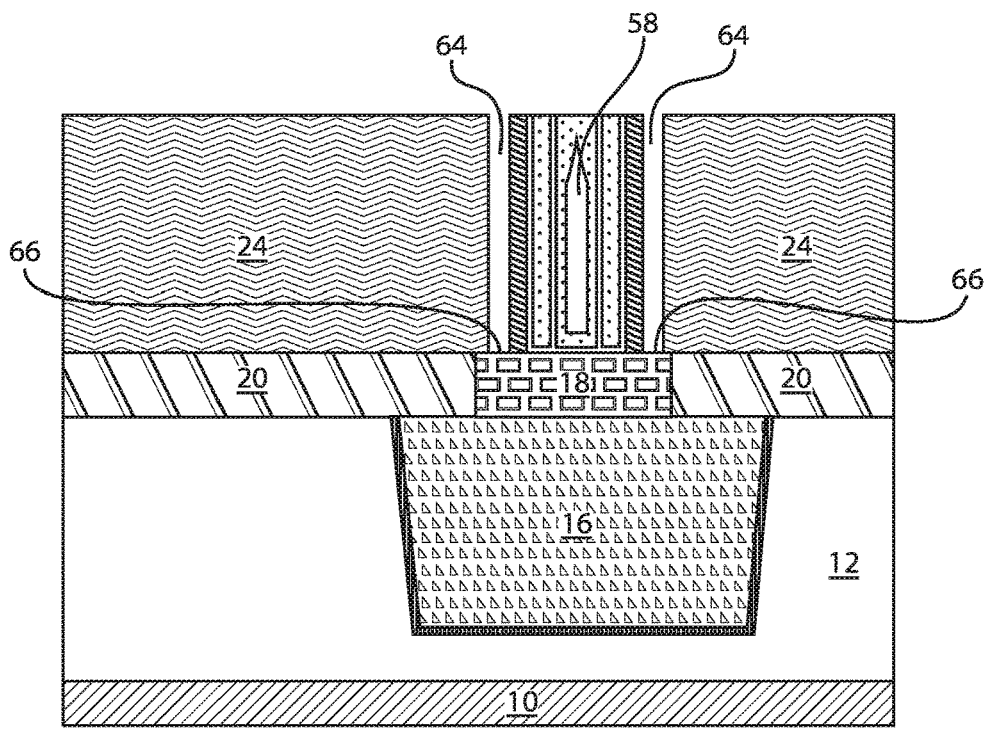
FIG. 11 is a cross-sectional view of the semiconductor structure of FIG. 10 where the sacrificial layer is removed to form second air gaps (or outer air gaps), in accordance with an embodiment of the present invention.

FIG. 11 is a cross-sectional view of the semiconductor structure of FIG. 10 where the sacrificial layer is removed to form second air gaps (or outer air gaps), in accordance with an embodiment of the present invention.

In various example embodiments, the remaining sacrificial layers 38 are removed to form cavities or trenches or second air gaps 64. A top surface 66 of the barrier layer 18 is also exposed. The air gaps 64 can be referred to as outer airgaps. Thus, the structure includes first air gap 58 and second air gaps 64. The first air gap 58 can be referred to as an inner or central air gap, whereas the second air gaps 64 can be referred to as outer air gaps. The second air gaps 64 can be larger than the first air gap 58. Stated differently, the second air gaps 64 can occupy a larger space than the first air gap 64. The first air gap 58 can have a substantially "candle" configuration, whereas the second air gaps 64 can have a substantially rectangular configuration. Thus, the shape of the first air gap 58 can be different than the shape of the second air gaps 64.

Formation of the dual air gaps 58, 64 results in reduction of heat loss to surrounding structures. The dual air gaps 58, 64 provide for better PCM cell isolation. The double or dual air gaps 58, 64 provide for PCM isolation inside and outside the remaining GST layers 52. Stated differently, the exemplary embodiments provide for PCM cell improvement with double air gaps with metal liners. Additionally, PVD GST deposition is employed to provide very thin GST thickness controllability.

The air gap 58 can be formed, e.g., by pinch-off dielectrics deposition and CMP. The pinch-off deposition approach allows for the dielectric 56 to pinch off in a region within the dielectric 56. The pinch-off dielectrics can include, e.g., plasma CVD of SiN, SiCN, SiCOH, carbon doped silicon oxide (pSiCOH), or high density plasma (HDP) $SiN/SiO_2$ in the formation of the air spacers/air gap 58. Therefore, air-gap formation can be achieved by employing dielectric deposition (by pinch-off of the dielectric layer).

The selection of these dielectric materials and processes has an impact in the voids (gaps 58, 64) dimension and volume. The overall void dimension and type of dielectric material are related to the total device capacitance reduction and reliability. Significant capacitance reduction with good reliability can be achieved on current 7-28 nm device structures through material, process, and structural/architectural optimization with the pinch-off deposition process approach described herein.

In conclusion, continued integrated circuit scaling deeper into the nanoscale regime has provided improved performance through shrinking of the Front-End-of-Line (FEOL) device and Back-End-of-Line (BEOL) interconnect. With scaling, resistance-capacitance (RC) delay is an increasing challenge, limiting overall product performance. Capacitance reduction is therefore important for device performance in both the FEOL and BEOL device structure. Conventional capacitance reduction methods for FEOL and BEOL while maintaining yield and reliability have needed significant material innovations such lower-k cap and bulk dielectrics with desired mechanical, structural, electrical and other properties. To further improve capacitance, other innovations in device structure and process integration are needed, such as air gaps and air spacers described in accordance with the exemplary embodiments of the present invention. The air spacer and air gap structures described herein employ pinch-off deposition to optimize the capacitance reduction, as well as to reduce heat loss, while maintaining yield and reliability.

Figure 12:
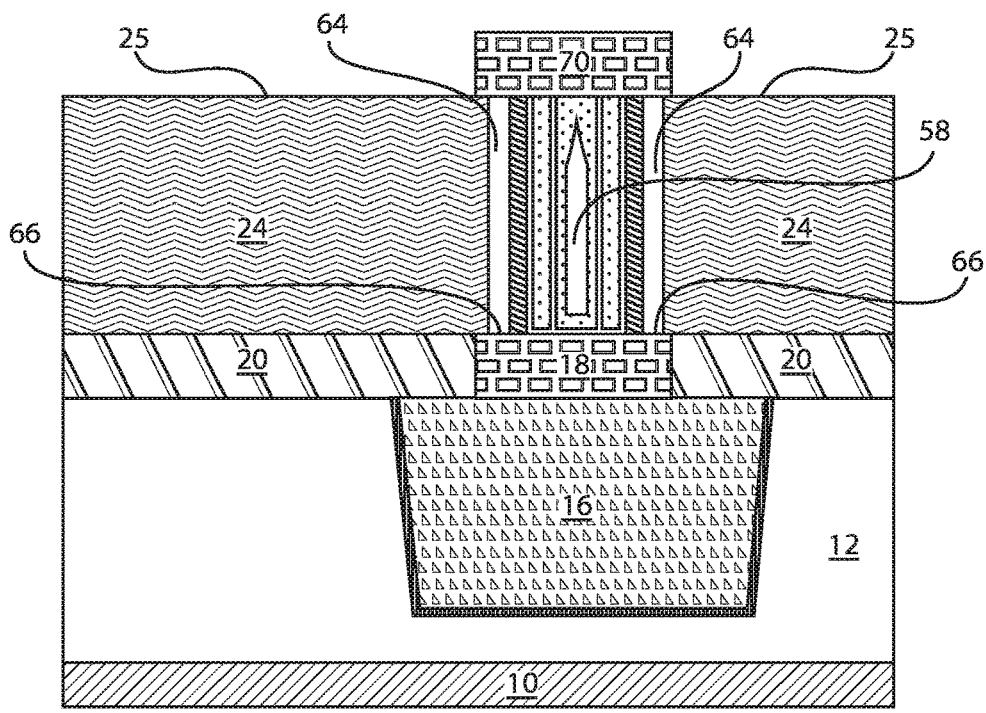
FIG. 12 is a cross-sectional view of the semiconductor structure of FIG. 11 where a top electrode is deposited, in accordance with an embodiment of the present invention.

FIG. 12 is a cross-sectional view of the semiconductor structure of FIG. 11 where a top electrode is deposited, in accordance with an embodiment of the present invention.

In various example embodiments, a top electrode 70 is formed over the first air gap 58 and the second air gaps 64.

The top electrode 70 can include copper tungsten, gold, aluminum, carbon nanotubes, carbon fullerenes, refractory metals, and/or other materials, and can be formed by CVD, ALD, PVD, damascene, dual-damascene, and/or other suitable processes. It is understood that further processing can be performed on the memory device such as formation of interconnect metal layers and inter-metal dielectric.

The top electrode 70 can include a conductive material, such as Cu, Al, Ag, Au, Pt, W, etc. In some embodiments, the top electrode 70 can include nitrides such as TiN, TaN, Ta or Ru.

In various exemplary embodiments, the height of the conductive material 70 can be reduced by chemical-mechanical polishing (CMP) and/or etching. Therefore, the planarization process can be provided by CMP. Other planarization process can include grinding and polishing.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for double air gaps in phase change memory cells (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reducing heat loss to adjacent semiconductor structures, the method comprising:
    forming a plurality of conductive lines within an interlayer dielectric;
    forming a barrier layer over at least one conductive line of the plurality of conductive lines;
    forming a via extending to a top surface of the barrier layer; and
    defining dual air gaps within the via and over the barrier layer, the dual airgaps separated by phase change material layers.

2. The method of claim 1, further comprising forming sacrificial layers adjacent sidewalls of the via.

3. The method of claim 2, further comprising forming spacers adjacent sidewalls of the sacrificial layers.

4. The method of claim 3, further comprising forming dielectric liners adjacent to the spacers.

5. The method of claim 4, wherein the phase change material layers are Ge—Sb—Te (germanium-antimony-tellurium or GST) alloy layers.

6. The method of claim 5, further comprising forming a dielectric between the GST alloy layers to define a first air gap of the dual air gaps.

7. The method of claim 6, further comprising removing the sacrificial layers adjacent sidewalls of the via to define a second air gap of the dual air gaps.

8. The method of claim 7, further comprising forming an electrode over the dual air gaps.

9. The method of claim 8, wherein the second air gap occupies more space than the first air gap.

10. A method for reducing heat loss to adjacent semiconductor structures, the method comprising:
    forming a barrier layer over at least one conductive line of a plurality of conductive lines;
    forming a via to the first barrier layer;
    defining a first air gap between Ge—Sb—Te (germanium-antimony-tellurium or GST) alloy layers; and
    defining second air gaps on opposed ends of the first air gap.

11. The method of claim 10, further comprising forming sacrificial layers adjacent sidewalls of the via.

12. The method of claim 11, further comprising forming spacers adjacent sidewalls of the sacrificial layers.

13. The method of claim 12, further comprising forming dielectric liners adjacent to the spacers.

14. The method of claim 13, further comprising forming the GST alloy layers adjacent the dielectric liners.

15. The method of claim 14, further comprising forming a dielectric between the GST alloy layers to define the first air gap.

16. The method of claim 15, further comprising removing the sacrificial layers adjacent sidewalls of the via to define the second air gaps.

17. The method of claim 16, further comprising forming an electrode over the first and second air gaps.

18. A semiconductor structure for reducing heat loss to adjacent semiconductor devices, the semiconductor structure comprising:
    a plurality of conductive lines disposed within an interlayer dielectric;
    a barrier layer disposed over at least one conductive line of the plurality of conductive lines;
    a first air gap defined within a dielectric; and
    second air gaps defined on opposed ends of the first air gap, the second air gaps separated by phase change material layers.

19. The semiconductor structure of claim 18, wherein the phase change material layers are Ge—Sb—Te (germanium-antimony-tellurium or GST) alloy layers.

20. The semiconductor structure of claim 19, wherein an electrode is disposed over the first and second air gaps.

* * * * *